United States Patent
Matsuo

[11] Patent Number: 5,818,094
[45] Date of Patent: Oct. 6, 1998

[54] PACKAGE FOR HOUSING A SEMICONDUCTOR ELEMENT

[75] Inventor: Shogo Matsuo, Gamou-gun, Japan

[73] Assignee: Kyocera Corporation, Kyoto, Japan

[21] Appl. No.: 652,752

[22] Filed: May 23, 1996

[51] Int. Cl.[6] .......................... H01L 27/14; H01L 23/12; G02B 23/24
[52] U.S. Cl. .................. 257/434; 257/433; 257/683; 257/634; 257/788; 257/791
[58] Field of Search ................... 257/683, 634, 257/434, 433, 794, 787, 788, 791, 790

[56] References Cited

U.S. PATENT DOCUMENTS

| | | | |
|---|---|---|---|
| 4,001,863 | 1/1977 | Kobayashi et al. | 257/702 |
| 4,302,674 | 11/1981 | Adachi et al. | 257/707 |
| 4,410,927 | 10/1983 | Butt | 257/712 |
| 4,720,424 | 1/1988 | Eickman et al. | 257/788 |
| 4,745,470 | 5/1988 | Yabe et al. | 358/98 |
| 4,961,106 | 10/1990 | Butt et al. | 257/710 |
| 5,239,412 | 8/1993 | Naka et al. | 359/619 |
| 5,244,707 | 9/1993 | Shores | 257/678 |
| 5,391,915 | 2/1995 | Mukai et al. | 257/698 |
| 5,523,608 | 1/1996 | Kitaoka et al. | 257/433 |
| 5,583,376 | 12/1996 | Sickler et al. | 257/702 |

FOREIGN PATENT DOCUMENTS

| | | | |
|---|---|---|---|
| 0057870 | 4/1983 | Japan | 257/434 |
| 0023367 | 1/1986 | Japan | 257/434 |
| 0093976 | 4/1987 | Japan | 257/434 |
| 0124756 | 6/1987 | Japan | 257/434 |
| 0021414 | 1/1994 | Japan | 257/433 |

*Primary Examiner*—Tom Thomas
*Assistant Examiner*—Alexander Oscar Williams
*Attorney, Agent, or Firm*—Loeb & Loeb LLP

[57] ABSTRACT

A semiconductor element-housing package which hermetically houses a semiconductor element for protection against moisture in the atmosphere by bonding an insulating substrate and a lid by means of a sealing material, with a moisture absorbent having surface pores 10–100 Å in radius which is mixed in the insulating substrate and/or the sealing material formed of a resin.

8 Claims, 1 Drawing Sheet

PACKAGE FOR HOUSING A SEMICONDUCTOR ELEMENT

BACKGROUND OF THE INVENTION

1. Field of the Invention

The present invention relates to a package for housing a semiconductor element.

2. Description of the Related Art

Conventional semiconductor element-housing packages, particularly inexpensive semiconductor element-housing packages, are usually composed of an epoxy resin, and are constructed with an insulating substrate with a recess portion for housing a semiconductor element at a top surface thereof; a plurality of outer lead terminals which lead outward from the side of the recess portion in the insulating substrate;

and a lid which is attached to the top surface of the insulating substrate by means of a sealing material composed of an epoxy resin to cover the recess portion of the insulating substrate; the semiconductor element is attached to the bottom of the recess portion of the insulating substrate by means of an adhesive resin material while electrodes of the semiconductor element are electrically connected to each of the ends of the outer lead terminals via bonding wires, the lid is then bonded to the top surface of the insulating substrate by means of the sealing material to hermetically house the semiconductor element inside the container constructed of the insulating substrate and the lid, thus completing a semiconductor device.

This type of conventional semiconductor element-housing package, however, has a drawback in that since the insulating substrate and the sealing material are composed of epoxy resins which are poorly resistant to moisture, after a semiconductor element has been hermetically housed inside the container constructed of the insulating substrate and the lid, moisture in the atmosphere tends to penetrate into the recess portion in which the semiconductor element is housed through the insulating substrate and the sealing material, and the water which has penetrated into the recess portion causes oxidative corrosion of the electrodes of the semiconductor element, bonding wires, etc., and this results in shorting between the electrodes, the bonding wires, etc., causing loss of its function as a semiconductor device.

In cases where the semiconductor element housed in the inside is a solid state image pickup element, and the lid is composed of a transparent member such as glass, there has been presented an additional problem in that moisture which has penetrated into the container causes a clouding of the lid due to dew drops, and this prevents satisfactory photoelectric conversion of the solid state image pickup element.

In view of this fact, it has been attempted to improve the resistance to moisture by mixing silica gel particles into the insulating substrate and/or the sealing material; nevertheless no sufficient effects have been produced, since the moisture absorbency of silica gel becomes saturated once moisture is adsorbed on the entire surface of the particles.

SUMMARY OF THE INVENTION

The present invention, which has been accomplished in view of the drawbacks mentioned above, is aimed at providing a semiconductor element-housing package which effectively prevents penetration of moisture in the atmosphere into a container constructed of an insulating substrate and a lid, thereby allowing long-term, normal and steady operation of the semiconductor element housed inside the container.

The invention relates to a semiconductor element-housing package which is designed to hermetically house a semiconductor element inside by bonding an insulating substrate and a lid through a sealing material, characterized in that the insulating substrate and the sealing material are formed of resin, and a moisture absorbent with surface pores 10–100 Å in radius is mixed in the insulating substrate and the sealing material.

The invention is further characterized in that the mixed moisture absorbent comprises 1.0–50% by weight of the insulating substrate.

The invention is further characterized in that the mixed moisture absorbent comprises 1.0–50% by weight of the sealing material.

The invention is further characterized in that the moisture absorbent consists of particles of porous silica.

In addition, with the semiconductor element-housing package according to the invention, the semiconductor element is preferably a solid state image pickup element (e.g., a CCD), and the lid is formed of a transparent member. In other words, this preferred semiconductor element-housing package is used for construction of solid state image pickup devices (e.g., CCD products).

With the semiconductor element-housing package according to the invention, since a moisture absorbent with surface pores 10–100 Å in radius is mixed in the insulating substrate and the sealing material composed of resin, the moisture absorbent prevents penetration of moisture in the atmosphere which may otherwise penetrate into the container constructed of the insulating substrate and the lid through the insulating substrate and the sealing material; as a result, there is little chance of causing oxidative corrosion of the electrodes of the semiconductor element housed inside the container and the bonding wires which establish electric connections between the respective electrodes of the semiconductor device and the outer lead terminals, thus allowing long-term, normal and steady operation of the semiconductor element.

In addition, in cases where the semiconductor element housed inside is a solid state image pickup element, and the lid is composed of a transparent member such as glass, there is no possibility of clouding of the lid due to dew drops, and this allows precise photoelectric conversion by the solid state image pickup element.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
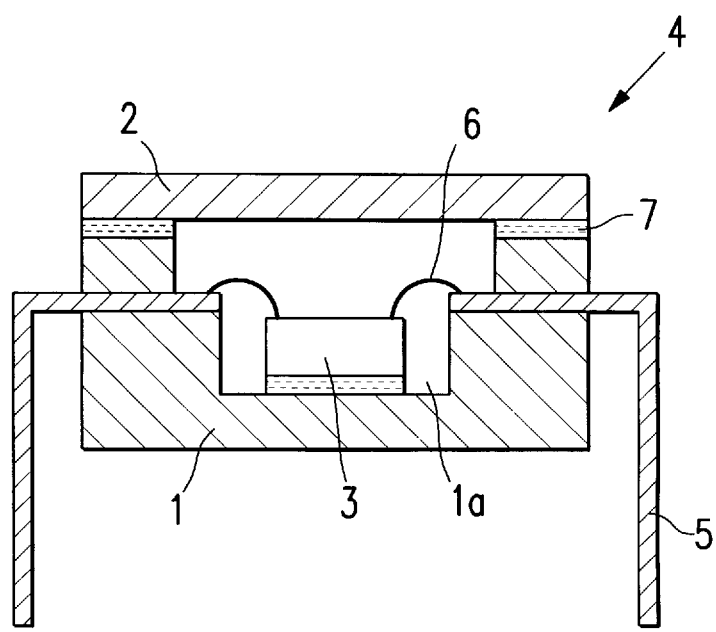
FIG. 1 is a cross sectional view illustrative of an embodiment of the semiconductor element-housing package according to the invention.

Now referring to the drawings, preferred embodiments of the invention are described below.

FIG. 1 illustrates an embodiment of the semiconductor element-housing package according to the invention, wherein 1 is an insulating substrate, and 2 is a lid. The insulating substrate 1 and the lid 2 form an insulated container 4 enclosing an air space for housing a semiconductor element 3.

The insulating substrate 1 has a recess portion 1a in the center of the top surface thereof which houses a semiconductor element 3, and the semiconductor element 3 is securely bonded to the bottom of the recess portion 1a by means of an adhesive resin.

The insulating substrate 1, which is composed of, for example, a resin such as an epoxy resin, is prepared by setting powdered and tabletted epoxy resin into a given mold by injection, and thermosetting the tablets at a temperature of 150°–200° C.

In addition, a moisture absorbent with surface pores 10–100 Å in radius is mixed inside the insulating substrate 1, and this moisture absorbent has the function of effectively preventing passage of moisture through the insulating substrate 1 composed of an epoxy resin.

Since a moisture absorbent is mixed inside the insulating substrate 1, after the semiconductor element 3 has been housed inside the container 4 constructed of the insulating substrate 1 and the lid 2, the moisture absorbent effectively prevents penetration of moisture in the atmosphere into the container 4 through the insulating substrate 1; as a result, little moisture penetrates into the container 4, and this completely prevents oxidative corrosion of electrodes of the semiconductor element 3 housed inside the container 4, etc., thus allowing long-term, normal and steady operation of the semiconductor element 3.

Here, the moisture absorbent is composed of, for example, spherical particles of porous silica, and is mixed in the insulating substrate 1 by mixing the spherical particles of silica into an epoxy resin before the epoxy resin is powdered and tabletted, and is then set in a given mold by injection to prepare the insulating substrate 1.

Typically, the spherical particles of porous silica with surface pores 10–100 Å in radius may be prepared as follows.

Zeolite $(Na(AlSi_5O_{12}).3H_2O, (Na_2, Ca) (Al_2Si_7O_{18}).6H_2O)$ with pores 3–10 Å in radius is immersed in dilute sulfuric acid to remove Al, Na and Ca components of the zeolite, thus providing particles of porous silica. These particles of porous silica are then immersed in an aqueous solution of sodium hydroxide to be made more porous and to increase the pore size, thereby adjusting the pore radii to 10–100 Å.

Since the silica particles prepared in this manner prevent a liquid epoxy resin or the like, which is the material of the insulating substrate and the sealing material, from penetrating into the surface pores even when the particles are added to and mixed with the resin, the surface property (or hygroscopicity) is maintained. This is because, among other reasons, the resin used for construction of the semiconductor element-housing package usually has a large molecular weight (within the range of approximately 300–10,000), most of the molecular structure is composed of straight chains, and further it exhibits a high viscosity of 1,000–50,000 cps when molded.

The moisture absorbent cannot completely adsorb moisture which has penetrated into the insulating substrate 1 when the surface pores have radii of less than 10 Å, whereas at radii greater than 100 Å, the specific gravity of the moisture absorbent becomes too small to disperse and mix the moisture absorbent throughout the insulating substrate 1 composed of an epoxy resin. Therefore, the moisture absorbent is limited to one that has a surface pore radius of 10–100 Å.

Furthermore, in cases where the mixed moisture absorbent comprises less than 1.0% by weight of the insulating substrate 1, passage of moisture through the insulating substrate 1 cannot be effectively prevented, whereas at proportions over 50% by weight, the powdered and tabletted epoxy resin which has been mixed with the moisture absorbent tends to have poor fluidity when it is set in a given mold by injection for preparation of the insulating substrate 1, and thus fails to provide the insulating substrate 1 in the desired shape. Accordingly, the mixed moisture absorbent preferably comprises 1.0 to 50% by weight of the insulating substrate 1.

A plurality of outer lead terminals 5 are attached to the insulating substrate 1, extending from the inside of the recess portion 1a to the outside, wherein electrodes of the semiconductor element 3 are electrically connected to respective sites of the outer lead terminals 5 which are exposed to inside the recess portion 1a, while those sites which are exposed to an outside thereof are connected to external electric circuits.

The outer lead terminals 5, which are composed of a metal material such as an iron-nickel-cobalt alloy or iron-nickel alloy, are shaped into given plates by processing, for example, an ingot (mass) of an iron-nickel-cobalt alloy, by rolling, stamping or other well-known metalworking methods.

Here, the outer lead terminals 5 are integrally attached to the insulating substrate 1, extending from the inside of the recess portion 1a to the outside thereof, by setting them at predetermined positions in the given mold in advance when the powdered and tabletted epoxy resin is set in the given mold by injection for preparation of the insulating substrate 1.

Layering of a metal such as nickel or gold which has excellent resistance to corrosion, and excellent brazability on the exposed surface of the outer lead terminals 5 to a thickness of 0.1 to 20.0 μm results not only in effective prevention of oxidative corrosion of the outer lead terminals 5, but also in ensured connections between the outer lead terminals 5 and the bonding wires 6, and between the outer lead terminals 5 and the external electric circuits. Therefore, preferably nickel, gold or the like is layered on the exposed surface of the outer lead terminals 5 to a thickness of 0.1 to 20.0 μm.

The insulating substrate 1, to which the outer lead terminals 5 are attached, has the lid 2 attached to its top surface by means of the sealing material 7; the semiconductor element 3 is hermetically housed in the container 4 by hermetically sealing the inside of the container 4 constructed of the insulating substrate 1 and the lid 2 through covering of the recess portion 1a of the insulating substrate 1 with the lid 2.

The lid 2 is constructed of a plate of glass, ceramic, metal, resin or the like, and is attached to the insulating substrate 1 through bonding by means of the sealing material 7.

The sealing material 7, which is used to attach the lid 2 to the insulating substrate 1 through bonding, is composed of an epoxy resin or the like, and is placed between the insulating substrate 1 and the lid 2 by previously applying a liquid epoxy resin to the top surface of the insulating substrate 1 or the underside of the lid 2 to a predetermined thickness by printing by a well-known screen printing process or the like.

The sealing material 7 has a moisture absorbent mixed therein which has surface pores 10–100 Å in radius, and the moisture absorbent has the function of effectively preventing passage of moisture through the sealing material 7.

Since a moisture absorbent is mixed inside the sealing material 7, after the semiconductor element 3 has been housed inside the container 4 constructed of the sealing material 7 and the lid 2, the moisture absorbent effectively prevents penetration of moisture in the atmosphere into the container 4 through the insulating substrate 1; as a result, little moisture penetrates into the container 4, and this completely prevents oxidative corrosion of electrodes of the semiconductor element 3 housed inside the container 4, etc., thus allowing long-term, normal and steady operation of the semiconductor element 3.

Here, the moisture absorbent is composed of the spherical particles of porous silica described above, and is mixed in the sealing material 7 by previously adding the particles of silica to a liquid epoxy resin for mixing therewith when the liquid epoxy resin is applied to the top surface of the insulating substrate 1 or the underside of the lid 2 by printing by a screen printing process or the like.

In addition, the moisture absorbent cannot completely adsorb moisture penetrated into the sealing material 1 when the surface pores have radii of less than 10 Å, whereas at radii greater than 100 Å, when the top surface of the insulating substrate 1 and the underside of the lid 2 are being coated with the sealing material 7 through application of a liquid epoxy resin by printing by a screen printing process or the like, the printability of the liquid epoxy resin is impaired, and thus it becomes difficult to coat the top surface of the insulating substrate 1 and the underside of the lid 2 with the sealing material 7 to a uniform thickness. Therefore, the moisture absorbent is limited to one that has a pore radius of 10–100 Å.

Furthermore, there is a tendency that in cases where the mixed moisture absorbent comprises less than 1.0% by weight of the sealing material 7, passage of moisture through the sealing material 7 cannot be effectively prevented, whereas at proportions over 50% by weight, when the top surface of the insulating substrate 1 and the underside of the lid 2 are being covered with the sealing material 7 through application of a liquid epoxy resin by printing by a screen printing process or the like, the printability of the liquid epoxy resin is impaired, and thus it becomes difficult to coat the top surface of the insulating substrate 1 and the underside of the lid 2 with the sealing material 7 to a uniform thickness. Accordingly, preferably the mixed moisture absorbent comprises 1.0 to 50% by weight of the sealing material 7.

As described above, with the semiconductor element-housing package according to the invention, the semiconductor element 3 is attached to the bottom of the recess portion 1a of the insulating substrate 1 by means of an adhesive while electrodes of the semiconductor element 3 are electrically connected to each of the ends of the outer lead terminals 5 via the bonding wires 6, the lid 2 is then bonded to the top surface of the insulating substrate 1 by means of the sealing material 7 to hermetically house the semiconductor element 3 inside the container 4 constructed of the insulating substrate 1 and the lid 2, thus completing a semiconductor device.

It is to be noted that the present invention is not limited to the embodiments described above, and a variety of modifications may be made without departing from the scope of the invention; for example, the present invention may be applied to the construction of a semiconductor element-housing package, where the semiconductor element is a solid state image pickup element, and the lid is composed of a transparent member such as glass. Here, there is no possibility of clouding of the lid due to dew drops, and this allows precise photoelectric conversion by the solid state image pickup element.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A package for housing a semiconductor element, the package comprising:
   an insulating substrate formed of resin,
   a lid, and
   a sealing material formed of resin for bonding the lid and the insulating substrate to provide a hollow portion for hermetically housing the semiconductor element therein, wherein
   at least one of the insulating substrate and the sealing material comprise a moisture absorbent with surface pores having a radius of 10–100 Å, and wherein the semiconductor element comprise a solid state image pickup element and the lid comprises a transparent member.

2. The package according to claim 1, wherein the moisture absorbent comprises 1.0–50% by weight of the insulating substrate.

3. The package according to claim 1, wherein the moisture absorbent comprises 1.0–50% by weight of the sealing material.

4. The package according to claim 1, wherein the moisture absorbent comprises particles of porous silica.

5. The package according to claim 1 wherein both the insulating substrate and the sealing material comprise the moisture absorbent with surface pores having a radius of 10–100 Å.

6. A package for housing a semiconductor element, the package comprising:
   an insulating substrate formed of resin,
   a lid, and
   a sealing material formed of resin for bonding the lid and the insulating substrate to provide an air space between the lid and the insulating substrate for hermetically housing the semiconductor element therein, wherein
   at least one of the insulating substrate and the sealing material comprises a moisture absorbent with surface pores having a radius of –100 Å, and wherein the semiconductor element comprises a solid state image pickup element and the lid comprises a transparent member.

7. A package for housing a semiconductor element, the package comprising:
   an insulating substrate formed of resin and having a recessed portion, the insulating substrate having a top surface surrounding the recessed portion,
   a lid having a peripheral portion, and
   a sealing material formed of resin for bonding the lid and the insulating substrate for hermetically housing the semiconductor element within the recessed portion, the sealing material surrounding the recessed portion and contacting only the peripheral portion of the lid and the top surface of the insulating substrate, wherein
   at least one of the insulating substrate and the sealing material comprises a moisture absorbent with surface pores having a radius of 10–100 Å, and wherein the semiconductor element comprises a solid state image pickup element and the lid comprises a transparent member.

8. The package according to claim 7 wherein the recessed portion constitutes an air space enclosed by the insulating substrate and the lid.

* * * * *